US00RE45361E

(19) United States
(12) Reissued Patent
Hirota

(10) Patent Number: US RE45,361 E
(45) Date of Reissued Patent: Feb. 3, 2015

(54) SEMICONDUCTOR DEVICE MANUFACTURING METHOD HAVING HIGH ASPECT RATIO INSULATING FILM

(71) Applicant: Toshiyuki Hirota, Tokyo (JP)

(72) Inventor: Toshiyuki Hirota, Tokyo (JP)

(73) Assignee: PS4 Luxco S.A.R.L., Luxembourg (LU)

(21) Appl. No.: 14/068,785

(22) Filed: Oct. 31, 2013

Related U.S. Patent Documents

Reissue of:
(64) Patent No.: 8,062,979
Issued: Nov. 22, 2011
Appl. No.: 12/046,639
Filed: Mar. 12, 2008

(30) Foreign Application Priority Data

Mar. 15, 2007 (JP) ..... 2007-066608

(51) Int. Cl.
*H01L 21/302* (2006.01)

(52) U.S. Cl.
USPC .... 438/692; 438/689; 438/700; 257/E21.545; 257/E21.546; 257/761; 257/762

(58) Field of Classification Search
USPC ..... 438/689, 692, 700; 257/E21.545, 257/E21.546, 759, 761, 762, 774
See application file for complete search history.

(56) References Cited

U.S. PATENT DOCUMENTS

| | | | | |
|---|---|---|---|---|
| 7,078,351 | B2 * | 7/2006 | Chiu et al. | 438/736 |
| 7,223,525 | B2 * | 5/2007 | Lipinski | 430/311 |
| 7,256,500 | B2 * | 8/2007 | Shimizu et al. | 257/758 |
| 7,626,234 | B2 * | 12/2009 | Inoue et al. | 257/374 |

FOREIGN PATENT DOCUMENTS

JP 6-204332 7/1994

* cited by examiner

*Primary Examiner* — Nadine Norton
*Assistant Examiner* — Maki Angadi
(74) *Attorney, Agent, or Firm* — Young & Thompson

(57) ABSTRACT

The object of the present invention is to embed an insulating film in a hole having a high aspect ratio and a small width without the occurrence of a void. The thickness of a polishing stopper layer is reduced by making separate layers respectively serve as a mask during forming the hole in a semiconductor substrate, and a stopper during removing the insulating film filled in the hole.

20 Claims, 5 Drawing Sheets

Figure 1
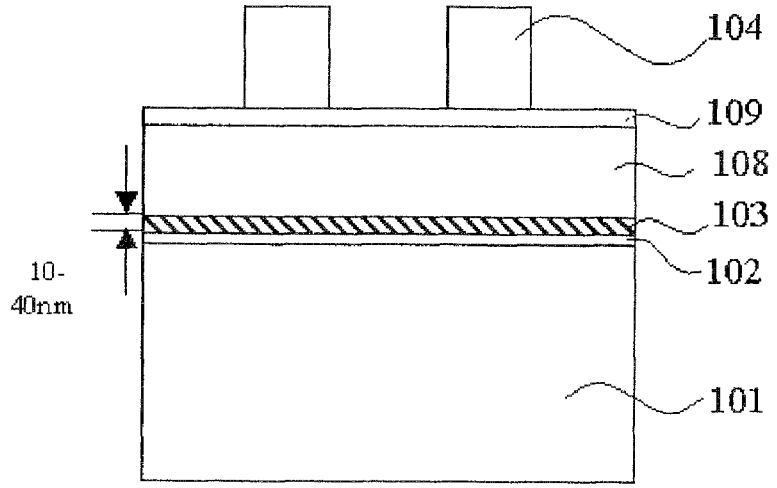
Fig.1A
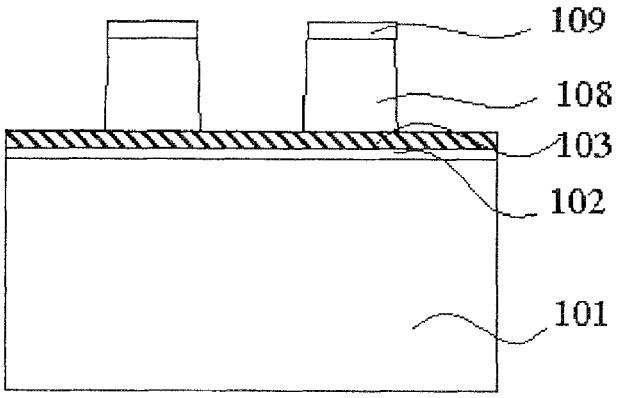
Fig.1B
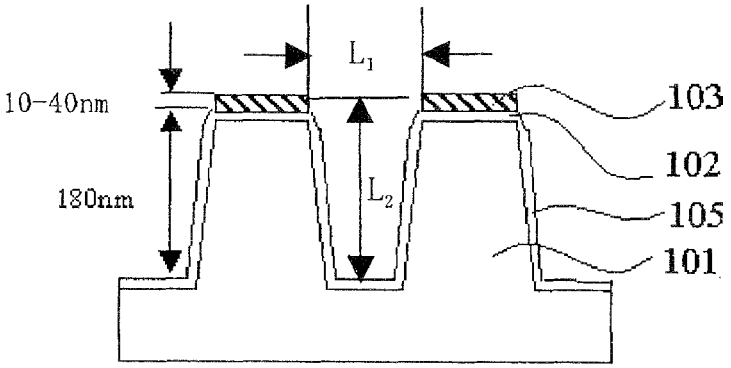
Fig.1C

Figure 2
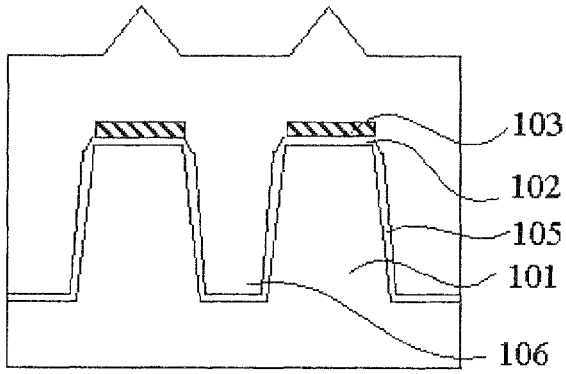
Fig.2A
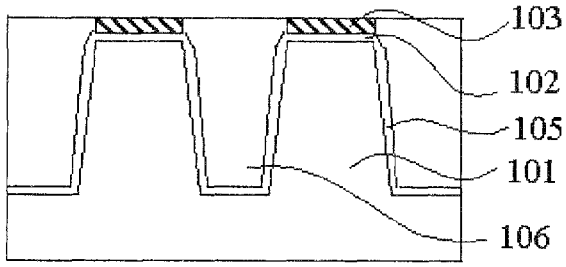
Fig.2B
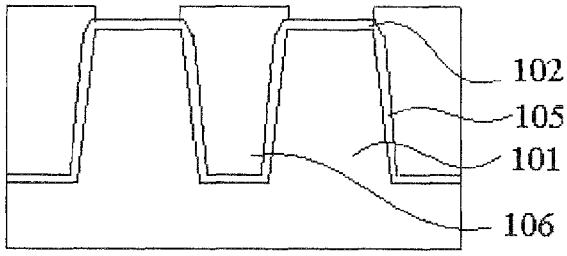
Fig.2C
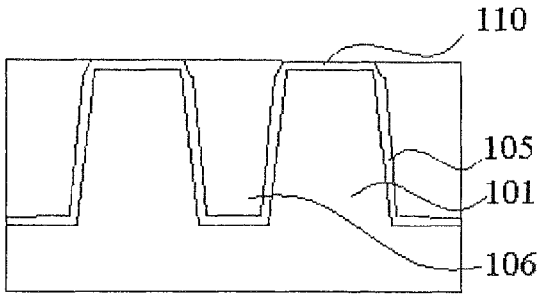
Fig.2D

Figure 3
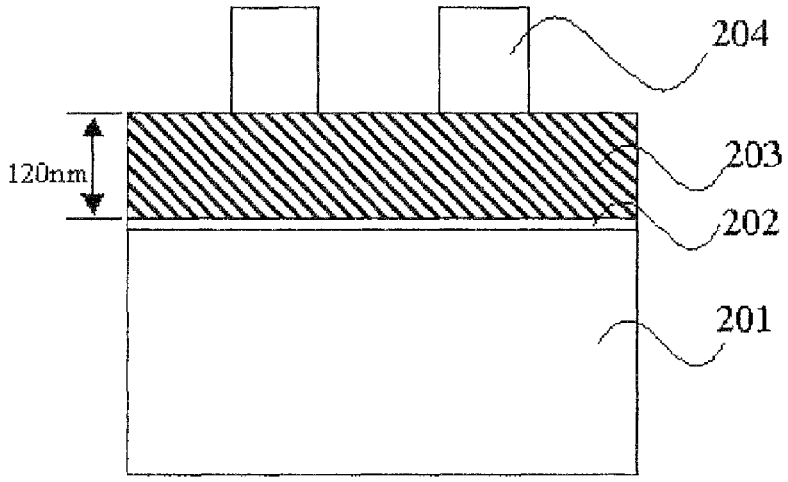
Fig.3A
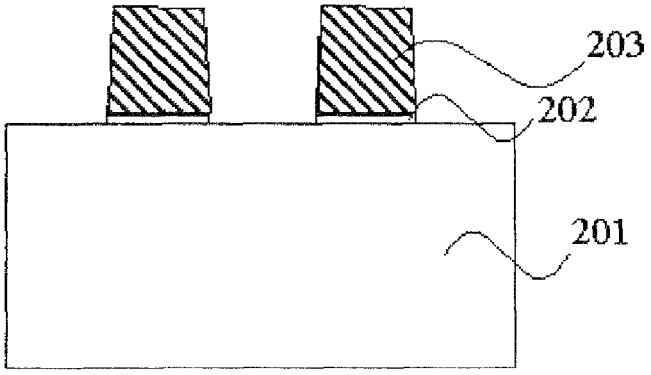
Fig.3B
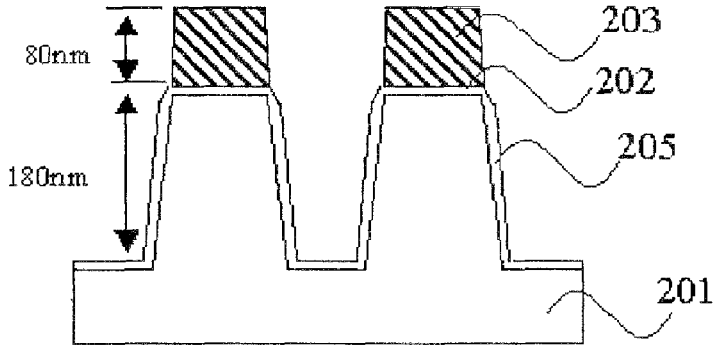
Fig.3C

Figure 4
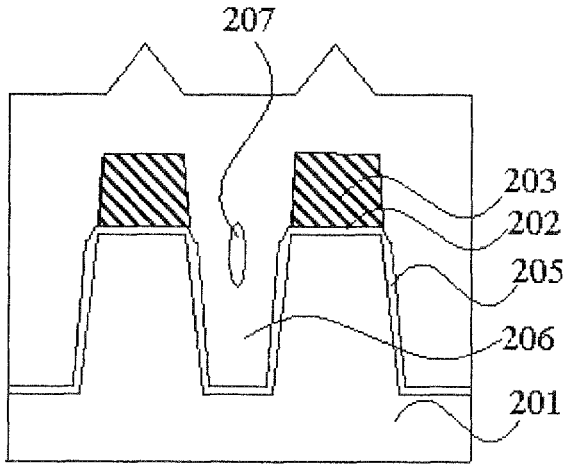
Fig.4A
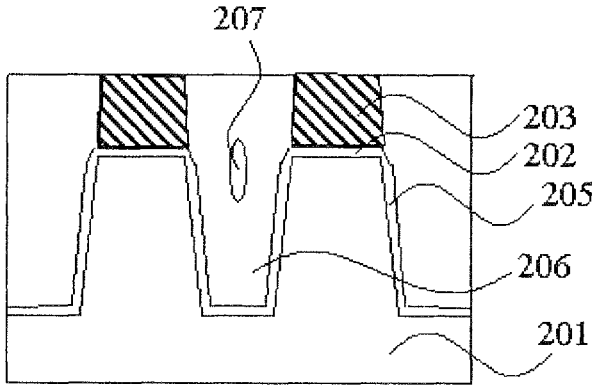
Fig.4B
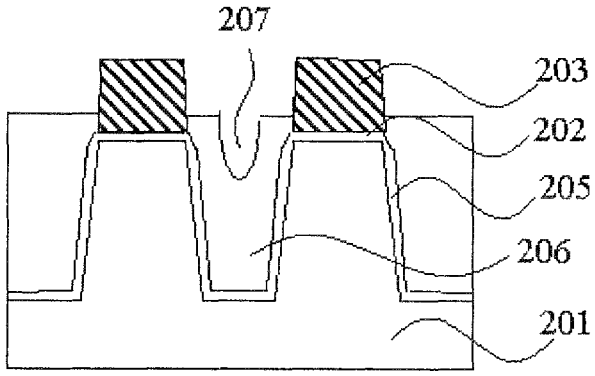
Fig.4C

Figure 5
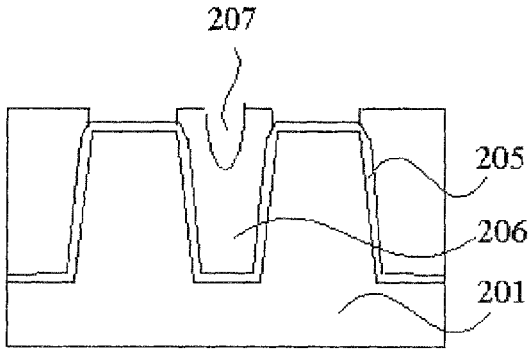
Fig.5A
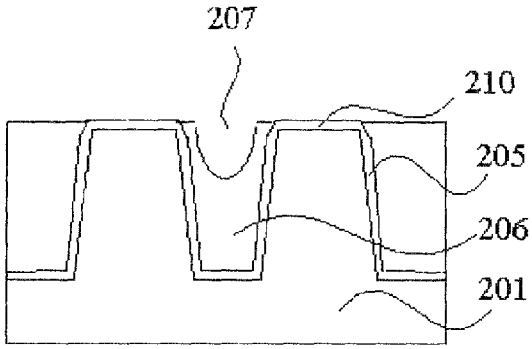
Fig.5B
Figure 6
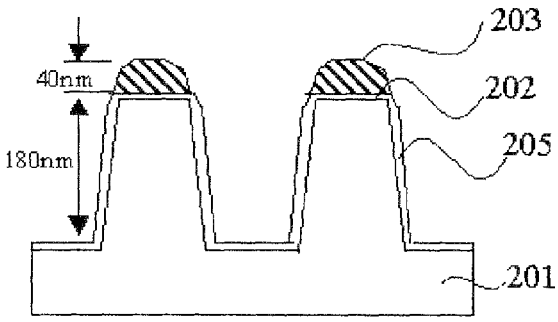

SEMICONDUCTOR DEVICE MANUFACTURING METHOD HAVING HIGH ASPECT RATIO INSULATING FILM

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

This application is based upon and claims the benefit of priority from Japanese Patent Application No. 2007-66608, filed on Mar. 15, 2007, whose disclosure is incorporated herein in its entirety by reference.

BACKGROUND OF THE INVENTION

1. Field of the Invention

The present invention relates to a manufacturing method of a semiconductor device which has an insulating film with a high aspect ratio, and which prevents a void from being formed in the insulating film.

2. Description of the Related Art

A related manufacturing method of semiconductor device is described with reference to FIG. 3 to FIG. 5. First, as shown in FIG. 3A, a pad oxide film 202 having a thickness of 9 nm is formed on a silicon semiconductor substrate 201 by thermal oxidation, and then, a silicon nitride film 203 having a thickness of 120 nm is formed on the pad oxide film 202 by an LP-CVD method. A pattern of photoresist 204 is formed on the silicon nitride film 203 by using a known lithography technique.

Next, as shown in FIG. 3B, the silicon nitride film 203 and the pad oxide film 202 are patterned by using the photoresist 204 as a mask and by a known etching technique. Then, the photoresist 204 is removed by ashing or the like in an oxygen plasma atmosphere.

Thereafter, as shown in FIG. 3C, the semiconductor substrate 201 is etched by using the patterned silicon nitride film 203 as a mask to form a hole for an isolation having a depth of 180 nm. The height of the silicon nitride film 203 is reduced to 80 nm from the height of 120 nm before the etching during etching the semiconductor substrate 201.

Next, in order to remove a damaged layer by the etching, a thermally oxidized film 205 having a thickness of about 10 nm is formed on the inner wall of the trench. Next, as shown in FIG. 4A, a silicon oxide film 206 is deposited on the whole surface by using a bias CVD method (an HDP-CVD method; High Density Plasma-Chemical Vapor Deposition Method).

Thereafter, as shown in FIG. 4B, by using the silicon nitride film 203 as a stopper, the silicon oxide film 206 is polished by a CMP using ceria slurry, to the upper end of the silicon nitride film 203, so as to be flattened. That is, in the above described related art, the nitride film 203 serves as a hard mask during trench processing (etching) of the silicon oxide film 206, and serves as a stopper during polishing the silicon oxide film 206 by the CMP.

Further, as shown in FIG. 4C, the silicon oxide film 206 is etched back by hydrofluoric acid, so that the upper end of the silicon oxide film 206 is lowered to near the lower end of silicon nitride film 203. At this time, the upper end of the silicon oxide film 206 is set at a position from 20 nm to 40 nm above the semiconductor substrate 201. This is because when the pad oxide film is removed to form a gate oxide film in a subsequent step, the silicon oxide film 206 is etched, and hence the amount of the silicon oxide film 206 as considered to be etched needs to be additionally left in advance. Therefore, the etch-back amount is determined by the thickness of the silicon oxide film 206 which is etched in the processes shown in FIG. 5A and FIG. 5B, and by the thickness of the silicon nitride film 203 at the stage of FIG. 4C.

Subsequently, as shown in FIG. 5A, the silicon nitride film 203 is selectively etched by hot phosphoric acid so as to be removed. Further, after the necessary impurity ion implanting process is completed, the pad oxide film 202 is removed by hydrofluoric acid, as shown in FIG. 5B. After washing, a gate oxide film 210 is formed by thermal oxidation.

In this way, it is possible to align the element forming surface of the substrate with the surface of the isolation region. In the above described related manufacturing method, a gate electrode (not shown) is then formed on the gate oxide film 210.

Further, Japanese Patent Laid-Open No. hei6-204332 discloses a method which is different from the above described method, and in which an isolation region is formed by such a way that after a hole is formed in a silicon substrate, the side surface of the hole is exposed, and the hole is further immersed into a solution having a predetermined composition, to fill the hole with a silicon oxide film.

In recent years, the miniaturization of devices has been advanced rapidly. According to the miniaturization of semiconductor devices, each part constituting the semiconductor devices is also required to be miniaturized. For example, as for the width between trenches constituting isolation regions, a semiconductor device having a width of 60 nm or less has been produced. In this case, the trench is embedded by the HDP-CVD method in the above described related art.

However, the HDP-CVD method for embedding the trench has approached the limit in the case of reducing the dimension of the width between the trenches to less than about 60 nm as described above. As shown in FIG. 4A, a void 207 has been caused in the trench in such case.

That is, the HDP-CVD method, which is also referred to as the bias CVD method, is a film forming method in which material molecules reach the semiconductor substrate at an angle close to the perpendicular direction during film formation, and in which the film formation and sputtering proceed at the same time. Therefore, the method is conventionally used as a film forming method suitable for embedding a predetermined material in a space (hole). However, when the space becomes narrow (for example, 80 nm or less) in comparison with the depth, the aspect ratio of the space to be embedded is increased, so as to prevent the material molecules from fully reaching the inside of the space. Further, when a phenomenon in which the sputtered material is reattached to the trench inner wall is once caused, the reattached part is closed to form a void there. The void 207 caused in this way is exposed on the surface of the semiconductor device in the subsequent process, so as to form an unintended recess in the isolation region (recess 207 in FIG. 4C and FIG. 5A).

When the void 207 is present, there has arisen a problem that in the subsequent process, an electroconductive material is embedded in the void 207, so as to cause a short circuit between adjacent gate electrodes, and thereby the manufacturing yield is lowered. Further, the occurrence of the void 207 has been unable to be completely prevented by improving the method for implementing the HDP-CVD method, such as by forming the films in multi-steps (repeating the film forming and etching steps). Further, it has been difficult to prevent the occurrence of the void by improving the hardware of the film forming apparatus.

Thus, when the related method is used, the following methods are conceivable as methods for preventing the occurrence of the void:

(a) a method of reducing the aspect ratio of the trench, and (b) a method of reducing the depth of the hole (the height of the sum of the depth of the trench in the semiconductor substrate and the height of the silicon nitride film (mask) 203) during embedding the insulating film, by reducing the height of the silicon nitride film 203.

Thus, as for the method of (a), when the present inventors reduced the aspect ratio of the trench to be embedded, by reducing the depth of the trench to 140 nm, the insulating film was able to be embedded without the occurrence of the void, even in the case of the trench width of 50 nm. However, it was found that due to the reduction in the trench depth, isolation characteristics, such as the junction leak characteristic, are deteriorated, and that the retention time (holding time) is deteriorated in the case where the isolation region having such characteristics is used for a device such as a DRAM (Dynamic Random Access Memory). That is, the prevention of the void and the retention time are in a trade-off relation.

As for the method of (b), the present inventors reduced the film thickness of the silicon nitride film 203 from 120 nm to 80 nm, in order to reduce the depth of the trench to be embedded by the HDP-CVD method. In this case, the residual film thickness of about 40 nm of the silicon nitride film 203 was expected in the stage shown in FIG. 2B. However, when the test was actually performed, there arose a problem that in the silicon nitride film having such film thickness, the clipping was caused in the side (corner) of the silicon nitride film 203 as shown in FIG. 6, so as to make the process unstable, and hence the processing size and shape could not be formed with satisfactory reproducibility. In this way, from the viewpoint of the process stability and the processing accuracy of the semiconductor substrate, and the like, it has been difficult to perform the etching by reducing the film thickness of the silicon nitride film (mask) 203, and hence it has been necessary to provide the thick silicon nitride film (mask) 203 having a predetermined thickness.

Further, when an insulating film is formed by the above described method as disclosed in Japanese Patent Laid-Open No. hei6-204332, there is a lower limit in the thickness of the film deposited in the hole in the intermediate process, resulting in a limit in the miniaturization. Further, there is a disadvantage that the manufacturing process is complicated, resulting in become long.

As a result of an extensive investigation of the above described problems, the present inventors have reached the present invention. That is, conventionally, one layer has been used as the mask during forming the hole in the semiconductor substrate and as the polishing stopper during removing the insulating film embedded in the hole. On the other hand, in the present invention, the hard mask used during forming the hole in the semiconductor substrate and the polishing stopper used during removing the insulating film embedded in the hole are formed as separate layers, respectively, so as to thereby reduce the thickness of the polishing stopper layer. As a result, an object of the present invention is to make it possible to embed an insulating film in a hole having a high aspect ratio and a small width, without the occurrence of a void.

SUMMARY OF THE INVENTION

An aspect according to the present invention relates to a semiconductor device manufacturing method comprising:

preparing a semiconductor substrate;

forming a thermally oxidized film on the semiconductor substrate by thermally oxidizing the surface of the semiconductor substrate;

forming a polishing stopper layer on the thermally oxidized film;

forming a hard mask A by patterning a hard mask material after forming the hard mask material on the polishing stopper layer;

forming a hole in the polishing stopper layer, the thermally oxidized film and the semiconductor substrate, by etching the polishing stopper layer, the thermally oxidized film and the semiconductor substrate using the hard mask A;

removing the hard mask A;

forming a thermally oxidized film in a part where the semiconductor substrate is exposed, by thermally-oxidizing the semiconductor substrate;

depositing an insulating film on the whole surface;

removing the insulating film by CMP using the polishing stopper layer as a stopper; and removing the polishing stopper layer.

Note that in the present invention, the "hole" means a recessed part formed between projecting parts which are constituted by the polishing stopper layer, the thermally oxidized film, and the semiconductor substrate under the thermally oxidized film, after the step of forming a hole.

The "hole width" means a lateral width (interval) between the polishing stopper layers on both sides of the hole formed after the step of forming a hole defined as described above. For example, the width of the hole is denoted by reference character $L_1$ in FIG. 1C.

The "hole depth" means the height from the bottom of the recessed part to the top of the polishing stopper layer in the hole formed after the step of forming a hole defined as described above. For example, the hole depth is denoted by reference character $L_2$ in FIG. 1C.

The "hole aspect ratio" means (hole depth)/(hole width), which are defined as described above, respectively. For example, the hole aspect ratio is denoted by the reference characters as L2/L1 in FIG. 1C. Further, the "hard mask A" means a mask which is different from photoresist, and which has etching resistance higher than that of photoresist and is used to facilitate the etching of the polishing stopper layer, the thermally oxidized film, and the semiconductor substrate.

In the present invention, the hard mask used for etching the semiconductor substrate and the polishing stopper layer used for removing the insulating film embedded in the hole are respectively provided as separate layers. Thereby, the reduction in the thickness of the polishing stopper layer by the etching need not be considered, and hence it is possible to provide a thin polishing stopper layer in advance. As a result, the hole depth (effective embedding depth) during embedding the insulating film in the hole, can be reduced, so as to prevent the occurrence of the void, and thereby the uniform insulating film can be embedded without the occurrence of the void in the hole. Further, the manufacturing yield can be improved, and also the wet etching, which is performed in the related method and has low controllability, can be eliminated to thereby suppress variations in the processed shape. As a result, it is possible to manufacture devices having the same operating characteristics.

BRIEF DESCRIPTION OF THE DRAWINGS

FIG. 1 is showing an example of a manufacturing method of a semiconductor device according to the present invention;

FIG. 2 is showing an example of a manufacturing method of a semiconductor device according to the present invention;

FIG. 3 is showing an example of a manufacturing method of a related semiconductor device;

FIG. 4 is showing an example of a manufacturing method of a related semiconductor device;

FIG. 5 is showing an example of a manufacturing method of a related semiconductor device; and FIG. 6 is showing an example of a related semiconductor device.

In the drawings, the symbols have the following meanings; 101: semiconductor substrate, 102: pad oxide film, 103: nitride film, 104: photoresist, 105: thermally oxidized film, 106: CVD oxidized film, 108: carbon film, 109: mask B, 110: gate insulating film, 201: semiconductor substrate, 202: pad oxide film, 203: nitride film, 204: photoresist, 205: thermally oxidized film, 206: CVD oxidized film, 207: void, 210: gate insulating film

DETAILED DESCRIPTION OF THE PREFERRED EMBODIMENTS

A semiconductor device manufacturing method according to the present invention comprising:

preparing a semiconductor substrate;

forming a thermally oxidized film on the semiconductor substrate by thermally-oxidizing the surface of the semiconductor substrate;

forming a polishing stopper layer on the thermally oxidized film;

forming a hard mask A by patterning a hard mask material after forming the hard mask material on the polishing stopper layer;

forming a hole in the polishing stopper layer, the thermally oxidized film and the semiconductor substrate, by etching the polishing stopper layer, the thermally oxidized film and the semiconductor substrate using the hard mask A;

removing the hard mask A;

forming a thermally oxidized film in a part where the semiconductor substrate is exposed, by thermally-oxidizing the semiconductor substrate;

depositing an insulating film on the whole surface;

removing the insulating film by CMP using the polishing stopper layer as a stopper; and removing the polishing stopper layer.

As described above, in the manufacturing method according to the present invention, the polishing stopper layer and the hard mask A are provided on the semiconductor substrate. Then, the hard mask A is used as a mask during etching the materials of the semiconductor substrate, the thermally oxidized film, and the polishing stopper layer, while the polishing stopper layer is used as a stopper during removing the insulating film deposited on the whole surface. Thus, the reduction in the thickness of the polishing stopper layer by the etching need not be taken into consideration, and hence it is possible to provide in advance a thin polishing stopper layer. As a result, the hole depth (effective embedding depth) during embedding the insulating film in the hole can be reduced, whereby the occurrence of the void in the hole is prevented, so as to enable an uniform insulating film to be embedded. Further, the manufacturing yield can be improved, and also the wet etching, which is performed in the related method and has relatively low controllability, can be eliminated, so as to thereby suppress variations in the processed shape. As a result, it is possible to manufacture devices having the uniform transistor characteristics.

Note that in the step of forming a hole, the etching may be performed under the condition that the hard mask A is left, and a part of the hard mask A may be removed. Further, the hard mask A is constituted from one or more layers.

Here, in the related art, there has been no technique which, when forming a semiconductor device with the insulating material embedded in the hole as described above, is adapted to separately provide each of the polishing stopper layer used during removing the insulating layer and the mask used during etching the semiconductor substrate, and also such technique has never been attempted.

That is, the hard mask is generally used as an auxiliary when the etching resistance of photoresist is insufficient and the processing object cannot be sufficiently masked by the photoresist. As for the hard mask, there are cases where the hard mask needs to be removed after the processing object is processed, and where the hard mask may be left after the processing object is processed. For example, as in the STI processing, in the case of embedding the insulating material in the hole, the hard mask used in the processing needs to be removed after the hole (trench) pattern is formed in the semiconductor substrate.

In the related art, only a silicon nitride film can be used as the film which can be used as the mask for etching the semiconductor substrate and can be selectively removed. Here, for example, there is considered a case where a hard mask of a silicon nitride film (SiN) is used, and the aspect ratio is reduced during embedding the inside of the trench by the HDP-CVD. In this case, after the semiconductor substrate is etched by using the hard mask as shown in FIG. 3C, the silicon nitride film 203 serving as the hard mask is removed, and thereafter the inside of the trench is embedded by the HDP.

However, when this method is performed, the embedding characteristic in the trench is indeed improved, but a top part, in particular, a corner (edge) part of the semiconductor substrate 201, which is an element forming region during forming a film by the HDP-CVD, is damaged, resulting in an adverse effect in the $V_t$ shift or the like, which is a transistor characteristic. Further, the top part of the semiconductor substrate 201 serves as the polishing stopper layer during conducting CMP. However, in this state, the element forming region of the semiconductor substrate is exposed after the polishing by the CMP, so as to be subjected to the influence of contamination by slurry.

Further, in the related art, no investigation has been performed to provide a polishing stopper between the silicon nitride film 203 and the thermally oxidized film 202 in the process shown in FIG. 3C. On the other hand, according to the present invention, it is possible to reduce the thickness of the polishing stopper layer by such a way that the hard mask used during forming the hole in the semiconductor substrate and the polishing stopper used during removing the insulating film embedded in the hole are respectively formed as separate layers. As a result, it is possible to embed the insulating film in the hole having a high aspect ratio and a small width, without the occurrence of the void.

It is preferred that the polishing stopper layer is a nitride film. By using the nitride film as the polishing stopper layer, it is possible to stably remove the insulating film deposited on the whole surface.

Further, the respective layers used in the manufacturing method according to the present invention have the following features.

(A) Polishing Stopper Layer

The constituent material of the polishing stopper layer is harder to be polished during polishing by the CMP in the step of removing the insulating film, as compared with the constituent material of the insulating film embedded in the hole in the step of depositing an insulating film on the whole surface. Further, the constituent material of the polishing stopper layer is a material which can be easily removed without deteriorating the other parts of the semiconductor device.

(B) Hard Mask A

The material constituting the hard mask A is a material which can be etched at an etching rate sufficiently lower than those of the constituent materials of the semiconductor substrate, the polishing stopper layer, and the thermally oxidized film, by adjusting the etching condition in the step of forming a hole. Further, the constituent material of the hard mask A is a material which can be easily removed without deteriorating the other parts of the semiconductor device. As the constituent material of the hard mask A, there can be listed, for example, a carbon film formed by the PE-CVD method (for example, APF film from APPLIED MATERIAL Corporation) and a coatable organic material (non-photosensitive resist resin).

It is preferred that the step of forming a hard mask A comprises one of the following mask forming processes (1) and (2).

(1) A mask forming process comprising:

after forming a carbon film as the hard mask material on the polishing stopper layer and then forming photoresist containing silicon on the carbon film, patterning the photoresist containing silicon by lithography; and forming the hard mask A by patterning the carbon film by using the patterned photoresist containing silicon as a mask.

(2) A mask forming process comprising:

after forming as the hard mask material a carbon film and a mask B successively on the polishing stopper layer and then forming photoresist on the mask B, patterning the photoresist by lithography;

patterning the mask B by using the patterned photoresist as a mask; and patterning the carbon film by using the patterned mask B as a mask.

In the case of the above described mask forming process (1), the hard mask A is constituted by only one layer of the carbon film, while in the case of the above described mask forming process (2), the hard mask A is constituted by two layers of the carbon film and the mask B.

As the constituent material of the hard mask A used in the above described mask forming process (1) or (2), there can be listed, for example, $SiO_2$ or the like, as an oxide film based material formed by using the PE-CVD method (Plasma Enhanced Chemical Vapor Deposition Method) and the PE-ALD method (Plasma Enhanced Atomic Layer Deposition Method). Further, SiOC (carbon doped silicon oxide film) and SiON (silicon oxynitride) can also be used. Typically, the film thickness of the hard mask A is set from to 15 to 60 nm. Further, the film thickness of the carbon film is typically set to from 200 to 250 nm.

In the above described mask forming process (1), by using photoresist containing silicon (bilayer photoresist), high etching resistance can be provided for the photoresist, and sufficiently low etching selectivity can be provided for the carbon film. As a result, the carbon film can be effectively etched by using the photoresist as a mask.

In the above described mask forming process (2), first, only the mask B which can be used as a mask during etching the carbon film, that is, which has a sufficiently low etching selectivity as compared with the carbon film, is patterned by using ordinary photoresist. Then, the carbon film is etched by using the mask B as a mask. The photoresist which is generally used may not have etching resistance in the ordinary etching condition of the carbon film. Thus, in the above described mask forming process (2), the carbon film can be effectively etched by using two processes, that is, by such a way that first the mask B used for etching the carbon film is formed, and then the carbon film is etched by using the mask B as a mask.

Further, it is preferred to perform the respective processes as follows.

(a) In the step of removing a hard mask A, the hard mask A is removed by ashing.

(b) In the step of depositing an insulating film on the whole surface, the insulating film is deposited by the CVD method.

It is possible to obtain an excellent effect even by independently performing each of the above described processes of (a) and (b), but it is preferred to perform both the processes of (a) and (b). By performing both the above described processes of (a) and (b), even in the case where a deeper hole is provided, it is possible to effectively prevent the occurrence of the void in the insulating film embedded in the hole.

It is preferred that the hole width (distance between the polishing stopper layers) is set to from 50 to 80 nm. It is possible to effectively embed the insulating material in the hole by setting the hole width to 50 nm or more. Further, when the hole width is set to 80 nm or less, it is possible to embed the insulating material in the fine hole by preventing the occurrence of the void more effectively as compared with the related method.

Further, the preferred dimensional ranges of the respective parts formed after the step of forming a hole are described as follows.

Polishing stopper layer thickness is from 10 to 50 nm

Thermally oxidized film thickness is from 9 to 10 nm

Hole depth (height from the bottom of the recessed part in the semiconductor substrate to the top of the polishing stopper layer provided on the thermally oxidized film on the semiconductor substrate) is from 170 to 260 nm Hole aspect ratio is from 2 to 5

In the manufacturing method according to the present invention, it is possible to stably embed the insulating material in the hole without the occurrence of the void, even in the case where the dimensions of the respective parts are set to the above described fine ranges.

Further, it is preferred that the insulating film deposited in the hole of the semiconductor substrate (hole part constituted by the recessed part in the semiconductor substrate) constitutes the isolation region. By manufacturing the semiconductor devices comprising the isolation region (STI) in this way, it is possible to manufacture the devices which are able to be miniaturized and to suppress variations in the processed shape, and which have the uniform operating characteristics.

Although there will be described the present invention with reference to the following Example, the present invention is not limited to the following Example. The constitution and specific details in the present invention can be variously modified within the technical scope of the present invention in a manner which can be understood by one of ordinary skill in the art.

An example of the manufacturing method according to the present invention will be described with reference to FIG. 1 and FIG. 2. First, as shown in FIG. 1A, a pad oxide film (thermal insulating film) 102 having a thickness of 9 nm was formed on a semiconductor substrate 101 by thermal oxidation, and further a silicon nitride film (polishing stopper layer) 103 having a thickness from 10 nm to 50 nm was formed on the pad oxide film 102 by the LP-CVD method (Low Pressure Chemical Vapor Deposition Method). In the present invention, a carbon film 108 and a mask B 109 are formed on the silicon nitride film 103 as will be described below, and hence it is possible to reduce the thickness of the silicon nitride film 103 in this way.

Then, the carbon film 108 and a silicon oxide film as the mask B 109 were formed on the silicon nitride film 103 by using a known technique and by the PE-CVD method. It is possible to use a parallel flat plate type PE-CVD apparatus for forming the carbon film 108 and the mask B 109. Then, a pattern of photoresist 104 was formed by using a known lithography technique.

Note that when a function as an anti-reflection film during conducting lithography is provided to the mask B 109, there may be adopted a film in which nitrogen (N) or carbon (C) is doped, or a film having a laminated structure of such films and a silicon oxide film. In the example, in order to provide the function as the anti-reflection film to the mask B and to prevent the poisoning of ArF resist, a silicon oxide film containing carbon as an impurity was adopted by using a known technique.

Next, as shown in FIG. 1B, the mask B 109 was patterned by using the photoresist 104 as a mask. Then, the carbon film 108 was further patterned by using the patterned mask B 109 as a mask (the step of forming a hard mask A). The mask B 109 and the carbon film 108 constitute the hard mask A.

Next, as shown in FIG. 1C, the silicon nitride film 103 and the pad oxide film 102 were etched by using the patterned carbon film 108 as a mask. Subsequently, an isolation trench (hole) having a depth of 180 nm was formed by etching the semiconductor substrate 101 (the step of forming a hole). Further, the mask B 109 was also simultaneously removed by the etching at this time.

Then, the carbon film 108 used as the hard mask A was removed by performing plasma ashing in an oxygen atmosphere (the step of removing a hard mask A). Then, in order to remove the damaged layer by the etching, a thermally oxidized film 105 having a thickness of about 10 nm was formed on the trench inner wall (the surface of the semiconductor substrate except the part where the polishing stopper layer is provided; the part where the semiconductor substrate is exposed).

Next, as shown in FIG. 2A, a silicon oxide film as an insulating film 106 was deposited on the whole surface, so as to be embedded in the trench, by using the bias CVD method (HDP-CVD method). Here, in the example, the trench depth can be set to 180 nm which is the same level as the related one, but the silicon nitride film 103 is not used as a mask for the etching. This makes it possible to suppress the height of the silicon nitride film 103 to from 10 nm to 50 nm, as compared with the height of 80 nm in the related case. As a result, the effective depth of hole during embedding the hole is the sum of the trench depth and the height of the silicon nitride film 103, and the effective depth of hole is reduced as compared with the related effective depth. Thereby, it is possible to embed the hole by the HDP-CVD method without the occurrence of the void, even in the case where the minimum space between the trenches is set to about 50 nm.

Next, as shown in FIG. 2B, by using the silicon nitride film 103 as a stopper, the silicon oxide film 106 was polished to the upper end of the silicon nitride film 103 so as to be flattened, by the CMP using ceria slurry. In the example, it was possible to reduce the thickness of the silicon oxide film 106 to be deposited, by suitably setting the film thickness of the silicon nitride film 103. As a result, the required wet etch back process of the silicon oxide film 206 in the related art could be made unnecessary.

In the wet etch back process, an etching amount is determined by controlling etching time according to an etching rate. However, the etching rate is varied, so as to thereby result in an etching amount variation of about ±10%. For example, in the related art, when the residual film thickness of the silicon nitride film 103 in FIG. 2C is 80 nm, and when the silicon oxide film 106 is wet etched back by the film thickness of 60 nm by wet etching, the etching amount variation becomes ±6 nm, or the etching amount variation range becomes 12 nm. On the other hand, in the manufacturing method according to the example, the wet etch-back process is not needed, the projecting amount of the silicon oxide film 106 is determined by the uniformity of film thickness in the LP-CVD method. The uniformity of the nitride film in the LP-CVD method is ±3%. Thus, when the film thickness of the nitride film is set to 20 nm, the variation of the thickness is suppressed to ±0.6 nm, or the etching amount variation range becomes 1.2 nm.

That is, in the manufacturing method according to the example, the number of processes can be not only reduced, but also the process having low precision can be skipped, so as to thereby improve the processing precision. This difference is exhibited, for example as shown in FIG. 2D, as a difference in the variation of projecting amount of the silicon oxide film 106, and the difference in the variation of projecting amount is eventually exhibited as the variation in the transistor characteristics. When the variation in the transistor characteristics is large, leads to the deterioration in the deriving rate of high-speed products and the manufacturing yield.

Then, as shown in FIG. 2C, the silicon nitride film 103 was etched and removed by hot phosphoric acid. Further, after completion of a process of implanting impurity ions as required, the pad oxide film 102 was removed by hydrofluoric acid, and the washing was performed, as shown in FIG. 2D. Thereafter, the gate oxide film 110 was formed by thermal oxidation.

With the above described processes, the element forming surface of the substrate and the surface of the isolation region were able to be aligned with each other. After the gate oxide film 110 was formed, the gate electrodes (not shown) were further formed on the gate oxide film 110.

What is claimed is:

1. A semiconductor device manufacturing method comprising:

preparing a semiconductor substrate;

forming a thermally oxidized film on the semiconductor substrate by thermally-oxidizing the surface of the semiconductor substrate;

forming a polishing stopper layer on the thermally oxidized film;

forming a hard mask A by patterning a hard mask material after forming the hard mask material on the polishing stopper layer;

forming a trench in the polishing stopper layer, the thermally oxidized film and the semiconductor substrate, by etching the polishing stopper layer, the thermally oxidized film and the semiconductor substrate using the hard mask A;

wherein at least a portion of the hard mask A remains on the polishing stopper layer after the trench is formed in the semiconductor substrate;

removing the hard mask A;

forming a thermally oxidized film in a part where the semiconductor substrate is exposed, by thermally-oxidizing the semiconductor substrate;

forming an insulating film on the whole surface;

removing the insulating film by CMP using the polishing stopper layer as a stopper; and removing the polishing stopper layer.

2. The semiconductor device manufacturing method according to claim 1, wherein the polishing stopper layer is a nitride film 3. The semiconductor device manufacturing method according to claim 1, wherein the step of forming the hard mask A comprises one of the following mask forming processes of (1) and (2), (1) a mask forming process comprising:

after forming a carbon film as the hard mask material on the polishing stopper layer and then forming photoresist containing silicon on the carbon film, patterning the photoresist containing silicon by lithography; and forming the hard mask A by patterning the carbon film by using the patterned photoresist containing silicon as a mask,(2) A mask forming process comprising:

after forming as the hard mask material a carbon film and a mask B successively on the polishing stopper layer and then forming photoresist on the mask B, patterning the photoresist by lithography;

patterning the mask B by using the patterned photoresist as a mask; and patterning the carbon film by using the patterned mask B as a mask.

4. The semiconductor device manufacturing method according to claim 1, wherein in the step of removing the hard mask A, the hard mask A is removed by ashing, and in the step of forming the insulating film on the whole surface, the insulating film is deposited by a CVD method.

5. The semiconductor device manufacturing method according to claim 1, wherein the width of the trench formed in the step of forming the trench is from 50 to 80 nm.

6. The semiconductor device manufacturing method according to claim 1, wherein the depth of the trench formed in the step of forming the trench is from 170 to 260 nm.

7. The semiconductor device manufacturing method according to claim 1, wherein the aspect ratio of the trench formed in the step of forming the trench is from 2 to 5.

8. The semiconductor device manufacturing method according to claim 1, wherein the thickness of the polishing stopper layer is from 10 to 50 nm.

9. The semiconductor device manufacturing method according to claim 1, wherein the insulating film deposited in the trench in the semiconductor substrate constitutes an isolation region.

10. A semiconductor device manufacturing method comprising:

(a) forming a hard mask by patterning a hard mask material that overlies a polishing stopper layer that in turn overlies a first layer;

(b) forming a trench in the polishing stopper layer and the first layer, by etching the polishing stopper layer and the first layer through the hard mask, and wherein the hard mask continues to cover the polishing stopper layer after the trench is formed in the first layer;

(c) removing the hard mask;

(d) forming a second layer to fill the trench in the first layer and to cover adjacent regions of the semiconductor device; and (e) removing portions of the second layer outside of the trench in the first layer by CMP using the polishing stopper layer as a stopper.

11. The semiconductor device manufacturing method according to claim 10, further comprising:

(f) removing the polishing stopper layer after performing step (e).

12. The semiconductor device manufacturing method according to claim 10, wherein the first layer is a semiconductor substrate.

13. The semiconductor device manufacturing method according to claim 12, wherein the semiconductor substrate comprises a thermally oxidized film underlying the polishing stopper layer, formed by thermally-oxidizing a surface of the semiconductor substrate.

14. The semiconductor device manufacturing method according to claim 12, wherein the second layer is an insulating film, and wherein the insulating film filling the trench is a shallow trench isolation (STI) element.

*15. A semiconductor device manufacturing method comprising:*

*preparing a semiconductor substrate;*

*forming a thermally oxidized film on the semiconductor substrate by thermally-oxidizing the surface of the semiconductor substrate;*

*forming a polishing stopper layer on the thermally oxidized film;*

*forming a hard mask A by patterning a hard mask material after forming the hard mask material on the polishing stopper layer;*

*forming a trench in the polishing stopper layer, the thermally oxidized film and the semiconductor substrate, by etching the polishing stopper layer, the thermally oxidized film and the semiconductor substrate using the hard mask A;*

*wherein at least a portion of the hard mask A remains on the polishing stopper layer after the trench is formed in the semiconductor substrate;*

*removing the hard mask A;*

*forming an insulating film on the whole surface;*

*removing the insulating film by CMP using the polishing stopper layer as a stopper; and*

*removing the polishing stopper layer.*

*16. The semiconductor device manufacturing method according to claim 15, further comprising forming a silicon oxide film in a part where the semiconductor substrate is exposed.*

*17. The semiconductor device manufacturing method according to claim 15, wherein in the step of removing the hard mask A, the hard mask A is removed by ashing, and in the step of forming the insulating film on the whole surface, the insulating film is deposited by a CVD method.*

*18. The semiconductor device manufacturing method according to claim 15, wherein the width of the trench formed in the step of forming the trench is from 50 to 80 nm.*

*19. The semiconductor device manufacturing method according to claim 15, wherein the depth of the trench formed in the step of forming the trench is from 170 to 260 nm.*

*20. The semiconductor device manufacturing method according to claim 15, wherein the aspect ratio of the trench formed in the step of forming the trench is from 2 to 5.*

* * * * *